(12) United States Patent
Ueyama et al.

(10) Patent No.: US 11,018,031 B2
(45) Date of Patent: May 25, 2021

(54) CUTTING APPARATUS

(71) Applicant: DISCO CORPORATION, Tokyo (JP)

(72) Inventors: Hiromitsu Ueyama, Tokyo (JP); Kei Katoh, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/387,747

(22) Filed: Apr. 18, 2019

(65) Prior Publication Data

US 2019/0326136 A1 Oct. 24, 2019

(30) Foreign Application Priority Data

Apr. 20, 2018 (JP) .............................. JP2018-081632

(51) Int. Cl.
*H01L 21/67* (2006.01)
*B28D 5/00* (2006.01)
*B28D 5/02* (2006.01)
*H01L 21/78* (2006.01)

(52) U.S. Cl.
CPC ...... *H01L 21/67092* (2013.01); *B28D 5/0076* (2013.01); *B28D 5/022* (2013.01); *H01L 21/78* (2013.01)

(58) Field of Classification Search
CPC ....... B28D 5/0076; B28D 5/022; H01L 21/78; B26D 2007/0018; B26D 7/18
See application file for complete search history.

(56) References Cited

U.S. PATENT DOCUMENTS

| 2,753,908 | A  | * | 7/1956  | Anderson | ............. | B02C 18/142 |
|           |    |   |         |          |               | 241/73      |
| 10,130,953 | B1 | * | 11/2018 | Ranne   | ..................... | B02C 18/14 |
| 2012/0315739 | A1 | * | 12/2012 | Hashii | ................. | B24B 27/0633 |
|           |    |   |         |          |               | 438/460     |

FOREIGN PATENT DOCUMENTS

| JP | 2002239888 A  |   | 8/2002 |
|----|---------------|---|--------|
| JP | 2015005544 A  |   | 1/2015 |
| KR | 100937094 B1  | * | 1/2010 |

OTHER PUBLICATIONS

Translation of KR-100937094-B1 (Year: 2010).*
Translation of JP 2015005544 A (Year: 2015).*

* cited by examiner

*Primary Examiner* — Kenneth E Peterson
(74) *Attorney, Agent, or Firm* — Greer, Burns & Crain, Ltd.

(57) ABSTRACT

A cutting apparatus includes a cutting dust collection box that collects cutting dust and a cutting dust guide plate that is disposed on the downstream side in a processing feed direction relative to a chuck table and receives cutting water and the cutting dust that flow to the downstream side after cutting to guide the cutting water and the cutting dust to the cutting dust collection box. A cutting dust breaking unit that breaks the cutting dust into small pieces is disposed at a position onto which the cutting dust that flows from a plate-shaped cover drops over the cutting dust guide plate.

15 Claims, 3 Drawing Sheets

CUTTING APPARATUS

BACKGROUND OF THE INVENTION

Field of the Invention

The present invention particularly relates to a cutting apparatus having a function of treating remnants generated when a workpiece is cut.

Description of the Related Art

For example, package substrates called chip size package (CSP) substrate and quad flat non-leaded package (QFN) substrate are cut by a cutting apparatus and individual semiconductor device packages are manufactured. As disclosed in Japanese Patent Laid-open No. 2002-239888, a cutting apparatus for cutting a package substrate along streets (planned cutting lines) includes a chuck table that holds a workpiece (package substrate) and a cutting unit that cuts the workpiece. In the cutting unit, a cutting blade and a cutting water spraying unit for spraying cutting water onto the cutting blade are disposed. At the time of cutting, the cutting blade and the package substrate are cooled by spraying of the cutting water. When the package substrate is set on the chuck table, the chuck table moves forward and backward and cutting of the package substrate is carried out.

At this time, cutting dust such as remnants of the package substrate and the cutting water are scattered due to the rotation of the cutting blade. In the case of normal down-cutting, the cutting blade rotates in the forward movement direction of the chuck table and thus the cutting dust and the cutting water are scattered in the forward movement direction of the chuck table.

In a cutting apparatus described in Japanese Patent Laid-Open No. 2002-239888 and Japanese Patent Laid-Open No. 2015-5544, a remnant treating apparatus that treats remnants and cutting water scattered due to cutting of a package substrate is disposed. In the remnant treating apparatus, the scattered remnants and cutting water are received by a channel shape part disposed near a chuck table and are made to flow in the forward movement direction of the chuck table and the remnants and the cutting water are dropped onto an endless belt or inclined guide plate. The remnants dropped onto the endless belt or inclined guide plate are conveyed by movement of the endless belt or the tilt of the inclined guide plate and drop into a remnant collecting container to be collected.

SUMMARY OF THE INVENTION

However, in the above-described remnant treating apparatus, there is a problem that a remnant that is comparatively long halfway remains on the endless belt or on the inclined guide plate and remnants accumulate at the place.

Thus, an object of the present invention is to provide a cutting apparatus that can favorably collect cutting dust such as remnants.

In accordance with an aspect of the present invention, there is provided a cutting apparatus in which a side to which cutting water supplied to a cutting blade is scattered in association with rotation of the cutting blade is set as a downstream side of a processing feed direction and an opposite side to the downstream side is set as an upstream side of the processing feed direction. The cutting apparatus includes a chuck table that holds a workpiece, a cutting unit to which the cutting blade that cuts the workpiece held by the chuck table is mounted, a cutting water supply unit that supplies the cutting water to the cutting blade, and a processing feed mechanism that carries out processing feed of the chuck table in an X-axis direction. The cutting apparatus further includes an indexing feed mechanism that carries out indexing feed of the cutting unit in a Y-axis direction orthogonal to the X-axis direction, a plate-shaped cover that causes the cutting water and cutting dust to flow out to the downstream side of the chuck table in the processing feed direction, a cutting dust collection box that collects the cutting dust, and a cutting dust guide plate that is disposed on the downstream side in the processing feed direction relative to the chuck table and receives the cutting water and the cutting dust that flow to the downstream side after cutting to guide the cutting water and the cutting dust to the cutting dust collection box. The cutting dust collection box is formed in such a manner that the cutting dust collection box receives the cutting water and the cutting dust that flow from the cutting dust guide plate into the cutting dust collection box and at least a bottom part allows the cutting water to flow and catches the cutting dust, and collects the cutting dust. A cutting dust breaking unit that breaks the cutting dust into small pieces is disposed at a position onto which the cutting dust that flows from the plate-shaped cover drops over the cutting dust guide plate.

According to this configuration, the cutting dust such as remnants can be caused to drop onto the cutting dust guide plate after being broken into small pieces by the cutting dust breaking unit. This can prevent the cutting dust from remaining at the middle of the cutting dust guide plate and favorably collect the cutting dust in the cutting dust collection box.

The cutting apparatus according to the aspect of the present invention has the cutting dust breaking unit that breaks cutting dust into small pieces and thus can favorably collect the cutting dust such as remnants.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
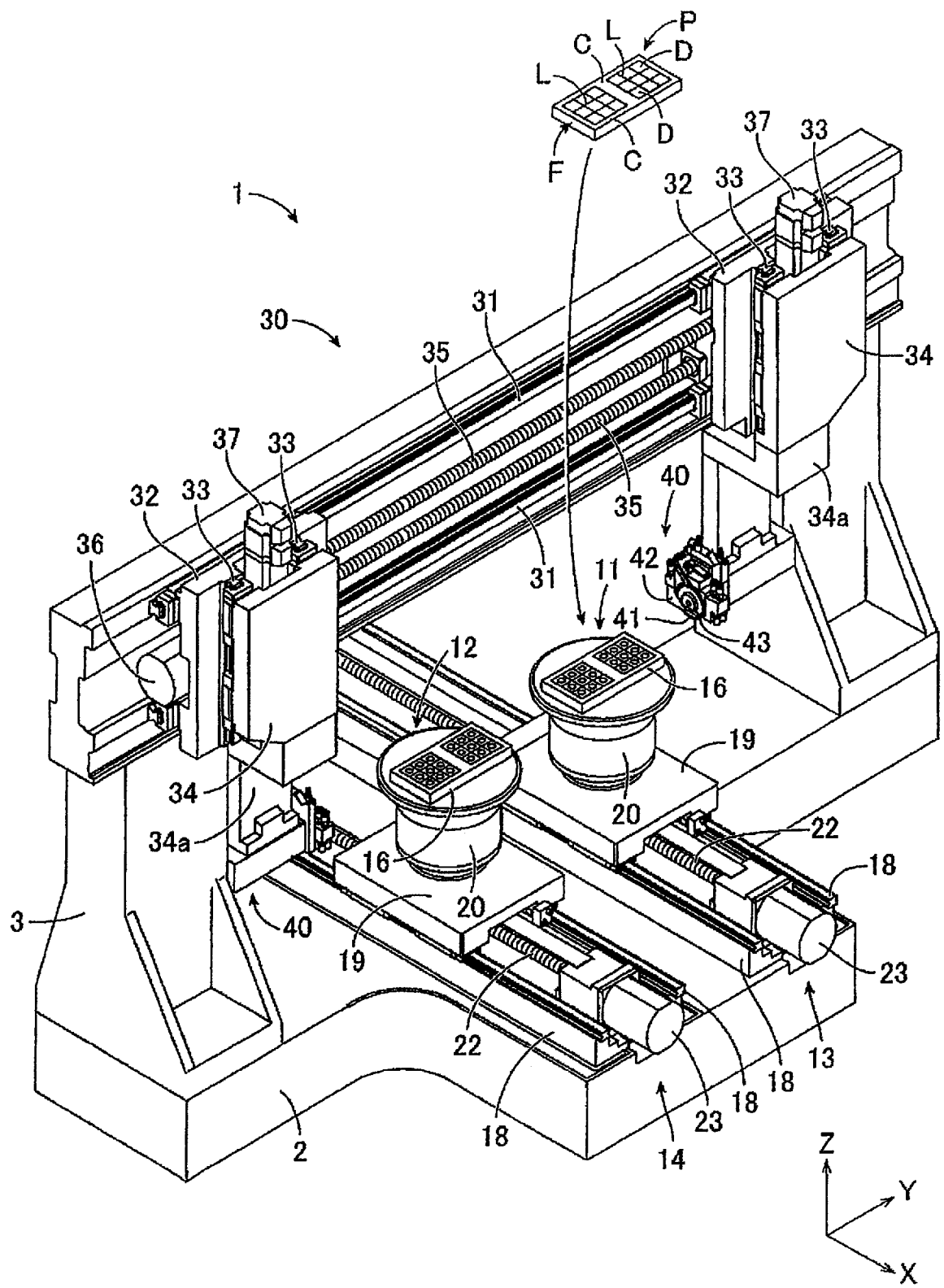
FIG. 1 is a schematic perspective view of a cutting apparatus of an embodiment.

A cutting apparatus according to the present embodiment will be described below with reference to the accompanying drawings. FIG. 1 is a schematic perspective view of the cutting apparatus of the embodiment.

As depicted in FIG. 1, a cutting apparatus 1 is configured to intermittently cause cutting blades 41 to cut into package substrates P on a first chuck table (holding unit) 11 and a second chuck table (holding unit) 12 to divide the package substrates P into individual devices D. The package substrate P depicted in FIG. 1 is one example of a workpiece and is a CSP substrate or QFN substrate, for example. The package substrate P is segmented by planned cutting lines L set in a lattice manner in the front surface thereof and the devices D are formed in the individual regions. In the package substrate P, two device parts F in which the plural devices D are formed are formed and a surplus joining member C is formed outside the device parts F. As described later, the surplus joining member C is cut off in advance before the device parts F are divided into the individual devices D.

The cutting apparatus 1 has a base 2 and a gate-shaped column 3 disposed upright over the base 2. Furthermore, the cutting apparatus 1 includes the first chuck table 11 and the second chuck table 12 that hold the package substrate P and a first processing feed mechanism (first processing feed unit) 13 and a second processing feed mechanism (second processing feed unit) 14 disposed to be juxtaposed in a Y-axis direction on the base 2. To the upper surface of each of the chuck tables 11 and 12, a jig 16 having plural suction ports corresponding to the individual devices D of the package substrate P is mounted.

The first processing feed mechanism 13 has a pair of guide rails 18 that are disposed on the upper surface of the base 2 and are parallel to an X-axis direction and an X-axis table 19 that is slidably disposed on the pair of guide rails 18 and is motor-driven. The first chuck table 11 is rotatably supported by a θ table 20 over the X-axis table 19. A nut part (not depicted) is formed on the back surface side of the X-axis table 19 and a ball screw 22 is screwed to this nut part. A drive motor 23 is joined to one end part of the ball screw 22. The ball screw 22 is rotationally driven by the drive motor 23 and the first chuck table 11 is moved (processing feed) in the X-axis direction along the guide rails 18.

The second processing feed mechanism 14 also has the same configuration as the first processing feed mechanism 13 except for that the target of movement is the second chuck table 12, and moves (processing feed) the second chuck table 12 in the X-axis direction. Therefore, each configuration of the second processing feed mechanism 14 is given the same numeral as the first processing feed mechanism 13 and description thereof is omitted.

The cutting apparatus 1 further includes an indexing feed mechanism (indexing feed unit) 30 disposed on the column 3. The indexing feed mechanism 30 carries out indexing feed of a pair of cutting units 40 in the Y-axis direction orthogonal to the X-axis direction and lifts and lowers the pair of cutting units 40 in a Z-axis direction above the respective chuck tables 11 and 12.

The indexing feed mechanism 30 has a pair of guide rails 31 that are disposed on the front surface of the column 3 and are parallel to the Y-axis direction and a pair of Y-axis tables 32 that are slidably disposed on the pair of guide rails 31 and are motor-driven. Furthermore, the indexing feed mechanism 30 has a pair of guide rails 33 that are disposed on the front surface of each Y-axis table 32 and are parallel to the Z-axis direction and Z-axis tables 34 slidably disposed on the respective guide rails 33. The cutting unit 40 is supported at the lower part of each Z-axis table 34 with the intermediary of an L-shaped bracket 34a.

A nut part (not depicted) is formed on the back surface side of each Y-axis table 32 and ball screws 35 are screwed to these nut parts. A drive motor 36 is joined to one end part of the ball screw 35. The ball screw 35 is rotationally driven by the drive motor 36 and the Z-axis table 34 and the cutting unit 40 are moved (indexing feed) in the Y-axis direction along the guide rails 31. Furthermore, between the Y-axis table 32 and each Z-axis table 34, a lifting-lowering mechanism 37 that lifts and lowers the cutting unit 40 in the Z-axis direction along the guide rails 33 is disposed.

In the cutting unit 40, the cutting blade 41 is mounted to the tip of a spindle (not depicted) that rotates around the Y-axis. The cutting blade 41 is formed of a resin blade obtained by binding diamond abrasive grains by a resin bond and forming them into a circular shape. The periphery of the cutting blade 41 is covered by a blade cover 42 and a spraying nozzle (cutting water supply unit) 43 that sprays cutting water toward the cutting blade 41 to supply the cutting water is disposed on the blade cover 42. The cutting unit 40 rotates the cutting blade 41 at high speed and carries out cutting processing of the package substrates P held by the respective chuck tables 11 and 12 while the cutting water is sprayed from the plural spraying nozzles 43 onto the cut part. By the cutting water, the cutting place is cooled and cutting dust generated in the cutting is rinsed away.

Figure 2:
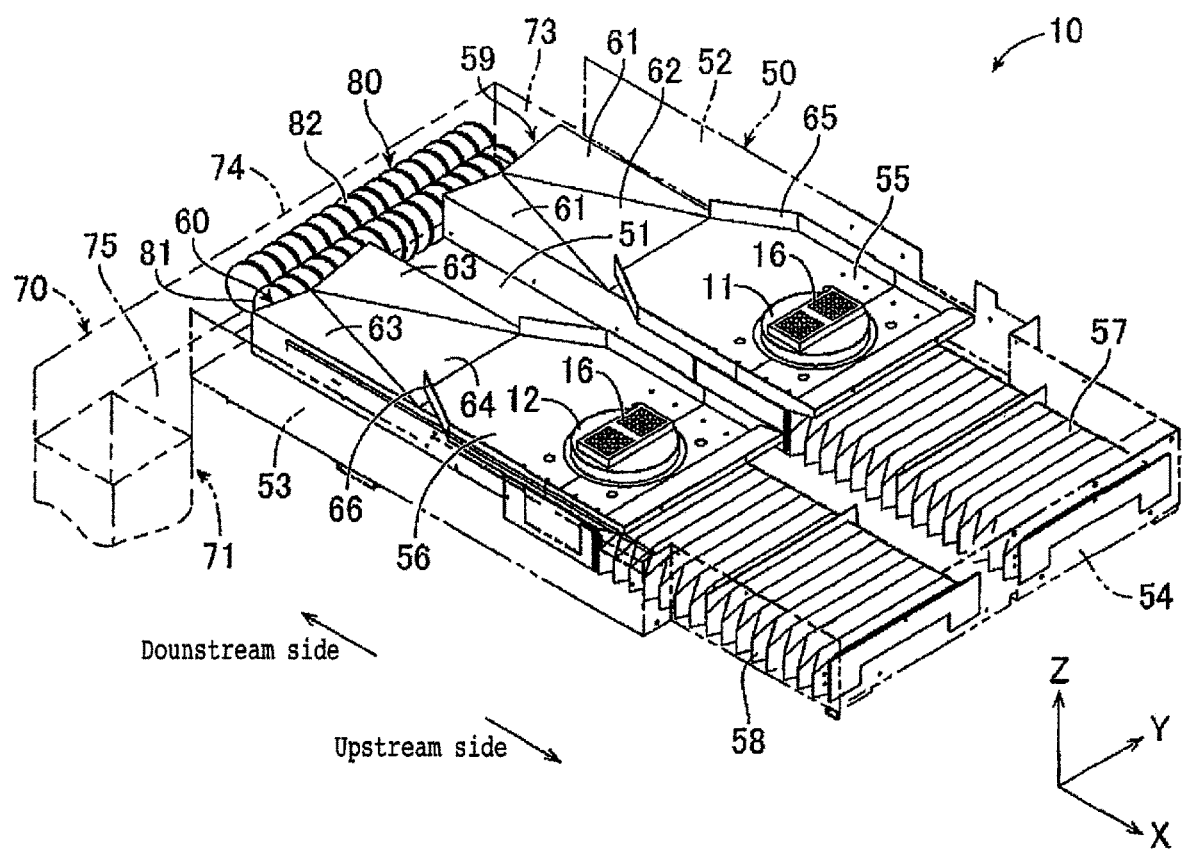
FIG. 2 is a schematic perspective view of a water case, plate-shaped covers, a cutting dust guide casing, and a cutting dust collection box positioned relative to the first and second chuck tables of the cutting apparatus of FIG. 1.

FIG. 2 is a schematic perspective view of a water case 50, plate-shaped covers 59, 60, a cutting dust guide casing 70, and a cutting dust collection box 71 positioned relative to the first 11 and second 12 chuck tables of the cutting apparatus of FIG. 1. As depicted in FIG. 2, the first chuck table 11 and the second chuck table 12 are disposed in an opening formed over a water case 50 (not depicted in FIG. 1). The opening is surrounded by a bottom part 51 forming the upper surface of the water case 50 and a pair of sidewalls 52 and 53 and an end wall 54 that protrude upward from the bottom part 51. The sidewall 52 and the sidewall 53 are wall parts that are separate in the Y-axis direction and extend in the X-axis direction. The end wall 54 is a wall part that is located on one end side of the bottom part 51 and the sidewalls 52 and 53 in the X-axis direction (upstream side) and extends in the Y-axis direction. In the opening, a first moving plate 55 that moves in the X-axis direction together with the first chuck table 11 and a second moving plate 56 that moves in the X-axis direction together with the second chuck table 12 are disposed. An accordion cover 57 is disposed between the first moving plate 55 and the end wall 54 and an accordion cover 58 is disposed between the second moving plate 56 and the end wall 54.

The respective processing feed mechanisms 13 and 14 (see FIG. 1) that move the first chuck table 11 and the second chuck table 12 in the X-axis direction are disposed in a waterproof space (not depicted) covered by the water case 50, the first moving plate 55, the second moving plate 56, the accordion covers 57 and 58, and so forth.

The cutting apparatus 1 includes a first plate-shaped cover 59 and a second plate-shaped cover 60 that cause the cutting water, cutting dust, and so forth to flow out to the downstream side of the processing feed direction (X-axis direction) of the first chuck table 11 and the second chuck table 12. Here, the downstream side of the processing feed direction (X-axis direction) refers to the side toward which the cutting water supplied to the cutting blade 41 at the time of cutting is scattered in association with rotation of the cutting blade 41. Furthermore, the opposite side to the downstream side is the upstream side.

In the opening, the first plate-shaped cover 59 and the second plate-shaped cover 60 are disposed on the downstream side of the first chuck table 11 and the second chuck table 12 in the X-axis direction and on the downstream side of the first moving plate 55 and the second moving plate 56. The first plate-shaped cover 59 has a pair of inclined surfaces 61 that gradually become lower toward the center in the Y-axis direction and a central inclined surface 62 that is located between this pair of inclined surfaces 61 in the Y-axis direction and gradually becomes lower from the upstream side to the downstream side. Similarly to the first plate-shaped cover 59, the second plate-shaped cover 60 has a pair of inclined surfaces 63 that gradually become lower toward the center in the Y-axis direction and a central inclined surface 64 that is located between this pair of inclined surfaces 63 in the Y-axis direction and gradually becomes lower from the upstream side to the downstream side.

An upright wall part 65 that protrudes upward is disposed at the peripheral edge of the first moving plate 55 and an upright wall part 66 that protrudes upward is disposed at the peripheral edge of the second moving plate 56. The upright wall part 65 has an opening that communicates with the side of the central inclined surface 62 of the first plate-shaped cover 59 and the upright wall part 66 has an opening that communicates with the side of the central inclined surface 64 of the second plate-shaped cover 60. When the package substrate P on the first chuck table 11 is cut, the cutting water containing cutting dust flows from on the first moving plate 55 to on the first plate-shaped cover 59. When the package substrate P on the second chuck table 12 is cut, the cutting water containing cutting dust flows from on the second moving plate 56 to on the second plate-shaped cover 60.

Inside each of the first plate-shaped cover 59 and the second plate-shaped cover 60, a sliding part (not depicted) that can slide relative to a rail (not depicted) laid on the bottom part 51 of the water case 50 is formed. The first plate-shaped cover 59 and the second plate-shaped cover 60 are guided movably in the X-axis direction by this rail and the sliding part. The end part of the first plate-shaped cover 59 on the upstream side is connected to the first moving plate 55 and the first plate-shaped cover 59 moves in the X-axis direction together with the first chuck table 11 and the first moving plate 55. The end part of the second plate-shaped cover 60 on the upstream side is connected to the second moving plate 56 and the second plate-shaped cover 60 moves in the X-axis direction together with the second chuck table 12 and the second moving plate 56. The end part of each of the first plate-shaped cover 59 and the second plate-shaped cover 60 on the downstream side is a free end that is not fixed to the water case 50 and so forth.

The first plate-shaped cover 59 and the second plate-shaped cover 60 each guide remnants (cutting dust) and the cutting water that have flown from the first moving plate 55 or the second moving plate 56 on the upstream side to the downstream side through the inclined surface 61 and the central inclined surface 62 or through the inclined surface 63 and the central inclined surface 64, and cause the remnants and the cutting water to flow out from the free end.

The cutting apparatus 1 includes a cutting dust guide casing 70 adjacent to the water case 50 and a cutting dust collection box 71 that can move upward and downward at a position continuous with the lower end of the cutting dust guide casing 70 on the downstream side in the X-axis direction relative to the free ends of the first plate-shaped cover 59 and the second plate-shaped cover 60.

The cutting dust guide casing 70 includes a first sidewall 73, second sidewalls 74, and a bottom wall (cutting dust guide plate) 75. The first sidewall 73 is disposed on the opposite side to the cutting dust collection box 71 in the Y-axis direction and is disposed upright to extend from the side of the water case 50 to the downstream side in the X-axis direction. The second sidewalls 74 are disposed upright to extend in the Y-axis direction from the first sidewall 73 to the cutting dust collection box 71. The second sidewall 74 is disposed on each of both end sides of the first sidewall 73 in the X-axis direction (see FIG. 4). The bottom wall 75 is disposed on the lower end side of the first sidewall 73 and the second sidewalls 74 and is formed as a slope part whose height in the Z-axis direction is changed along the Y-axis direction (see FIG. 5). The bottom wall 75 is inclined to sequentially become lower toward the cutting dust collection box in the Y-axis direction.

The cutting dust guide casing 70 is disposed on the downstream side of the first chuck table 11 and the second chuck table 12 that hold the package substrate P in the processing feed direction and receives, from the upper side to the inside, the cutting water and cutting dust that flow to the downstream side after cutting of the package substrate P. Then, by the inclination of the bottom wall 75, the cutting water and the cutting dust received into the cutting dust guide casing 70 are guided toward the cutting dust collection box 71.

The cutting dust collection box 71 is formed into a container shape of an upside-opened type that can receive the cutting water and the cutting dust that are guided by the cutting dust guide casing 70 and flow into the cutting dust collection box 71. A mesh part is disposed at the bottom part (neither is depicted) of the cutting dust collection box 71 and is formed in such a manner that remnants and cutting dust with a comparatively large size that get caught on the mesh part without passing through the mesh part can be caught and collected. The cutting water that flows on the bottom part of the cutting dust collection box 71 and passes through the mesh part is drained to the outside.

Next, referring back to FIG. 1, an operation example of the cutting apparatus 1 will be described. The package substrate P is conveyed to each of the first chuck table 11 and the second chuck table 12. In the following, the description will be made about the side of the first chuck table 11 regarding the case in which the first chuck table 11 and the second chuck table 12 operate in the same manner.

At the jig 16 placed on the first chuck table 11, the conveyed package substrate P is sucked and held. Subsequently, while being rotated, the cutting blade 41 of the cutting unit 40 is lowered until getting contact with the package substrate P, and the first chuck table 11 is moved to the downstream side in the X-axis direction. In the package substrate P, first, two boundaries between the device part F and the surplus joining member C are cut by the rotating cutting blade 41.

Thereafter, indexing feed of the cutting blade 41 is carried out in the Y-axis direction by driving of the indexing feed mechanism 30 and the other two boundaries between the device part F and the surplus joining member C are cut by the same method. Subsequently, after the first chuck table 11 is rotated by 90 degrees, similarly two boundaries between the device part F and the surplus joining member C are cut and the surplus joining member C is removed. Thereafter, the device part F is cut along all planned cutting lines L oriented in the X-axis direction. After this cutting, the planned cutting lines L oriented in the Y-axis direction are oriented into the X-axis direction by rotating the first chuck table 11 by 90 degrees and the same operation as the above is repeatedly carried out. Thereby, the package substrate P is cut along all planned cutting lines L oriented in the X-axis direction and the device parts F are divided into the individual devices D.

In the cutting of the package substrate P, in the cutting unit 40, always the cutting water is supplied toward the cutting blade 41 by the spraying nozzle 43. The supplied cutting water and cutting dust contained therein are scattered to the downstream side in the processing feed direction (X-axis direction) in association with the rotation of the cutting blade 41 and drop onto each moving plate 55 or 56 and each plate-shaped cover 59 or 60. Then, the cutting water and the cutting dust are guided by the first plate-shaped cover 59 or the second plate-shaped cover 60 to flow to the downstream side in the X-axis direction, and flow out from the free end of the first plate-shaped cover 59 or the second plate-shaped cover 60 to the side of the cutting dust guide casing 70.

In the cutting dust that flows out to the cutting dust guide casing 70, cutting chips of the package substrate P, a binding material such as the bond material, abrasive grains that have dropped off from the abrasive stone, the surplus joining member C that becomes a remnant, and so forth are included. Furthermore, the size and weight of the surplus joining member C that becomes a remnant is very large in some cases (for example, size is several centimeters). For this reason, the cutting apparatus 1 includes a cutting dust breaking unit 80 (see FIG. 2) for surely discharging the surplus joining member C that is contained in cutting dust and has a large size. The cutting dust breaking unit 80 will be described below.

Figure 3:
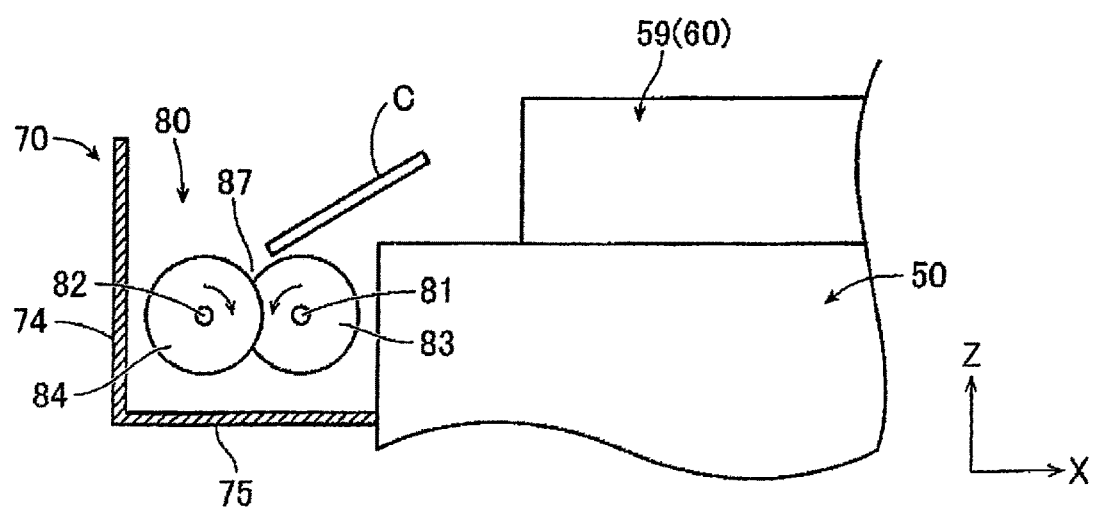
FIG. 3 is a partial schematic configuration diagram of a cutting dust breaking unit.

FIG. 3 is a partial schematic configuration diagram of the cutting dust breaking unit. As depicted in FIG. 2 and FIG. 3, the cutting dust breaking unit 80 is disposed at a position that is above the bottom wall 75 of the cutting dust guide casing 70 and onto which cutting dust flowing from the first plate-shaped cover 59 and the second plate-shaped cover 60 drops.

Figure 4:
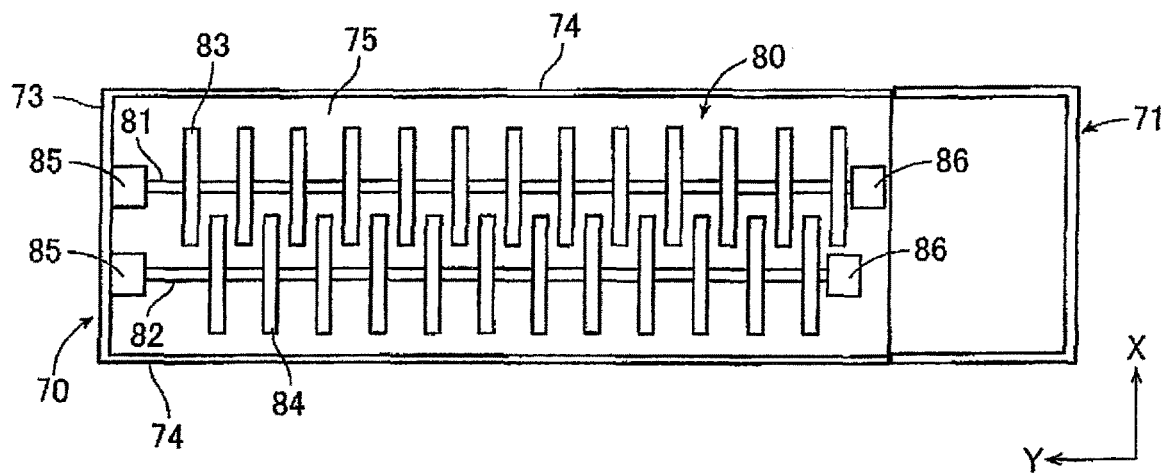
FIG. 4 is a schematic plan view of the cutting dust breaking unit.
Figure 5:
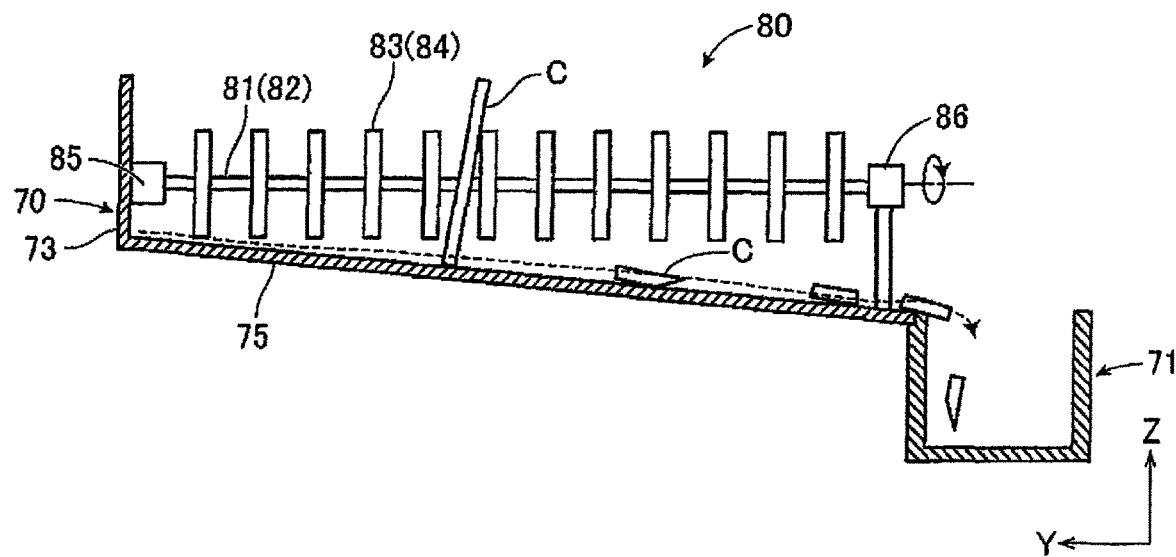
FIG. 5 is a longitudinal sectional view of part of FIG. 4.

FIG. 4 is a schematic plan view of the cutting dust breaking unit and FIG. 5 is a longitudinal sectional view of part of FIG. 4. As depicted in FIG. 4 and FIG. 5, the cutting dust breaking unit 80 includes two rotating shafts 81 and 82 that extend in the direction perpendicular to the processing feed direction, i.e. the Y-axis direction, and circular cutting blades 83 and 84 for cutting dust fixed to the respective rotating shafts 81 and 82 in such a manner that plural blades are lined up at a predetermined interval. The rotating shafts 81 and 82 are disposed to be juxtaposed in the processing feed direction (X-axis direction). A drive motor 85 is joined to one end part of each of the rotating shafts 81 and 82 and the other end part of each of the rotating shafts 81 and 82 is supported by a bearing 86 disposed upright from the bottom wall 75 in such a manner that the central axes of the rotating shafts 81 and 82 are horizontal. The rotating shafts 81 and 82 are enabled to rotate around the central axes by the drive motors 85. By this rotation, the fixed cutting blades 83 and 84 for cutting dust are also rotated around the same axes.

The cutting blades 83 and 84 for cutting dust are fixed to the rotating shafts 81 and 82 with the intermediary of fixing tools (not depicted) such as flange and nut in such a manner as to be incapable of relative rotation with respect to the rotating shafts 81 and 82. The cutting blades 83 and 84 for cutting dust can employ the same configuration as the above-described cutting blade 41, and the cutting blades 41 after use for a predetermined period may be reused because high cutting accuracy compared with that in cutting of the package substrate P is not requested. The cutting blades 83 for cutting dust fixed to one rotating shaft 81 and the cutting blades 84 for cutting dust fixed to the other rotating shaft 82 are disposed at positions that are shifted from each other (do not correspond with each other) in the extension direction of the rotating shafts 81 and 82 (Y-axis direction). Moreover, in the Y-axis direction, the cutting blades 83 and 84 are disposed in such a manner that the cutting blades 84 for cutting dust fixed to the other rotating shaft 82 partly enter into between the cutting blades 83 for cutting dust that are fixed to the one rotating shaft 81 and are adjacent to each other in the Y-axis direction. Furthermore, the cutting blades 83 and 84 are disposed in such a manner that the reverse relationship also holds. That is, the cutting blades 83 for cutting dust and the cutting blades 84 for cutting dust are disposed to be alternately located in the Y-axis direction at the middle position in the separation direction of the rotating shafts 81 and 82 (X-axis direction).

By disposing the cutting blades 83 and 84 in this manner, as depicted in FIG. 3, valley parts 87 are formed on the upper side of the respective cutting blades 83 and 84 for cutting dust and the surplus joining member C that is long as cutting dust can be dropped into this valley part 87 or the gap between the cutting blades 83 and 84 for cutting dust adjacent to each other. Furthermore, by rotating the respective cutting blades 83 and 84 for cutting dust in arrow directions in FIG. 3, the surplus joining member C that has dropped into between them can be caused to get caught by the cutting blades 83 and 84 to be broken into small pieces each having a size equal to or smaller than the predetermined interval.

Here, the distance from the rotating shafts 81 and 82 to the bottom wall 75 is set shorter than the maximum length of the surplus joining member C desired to be broken. Because the bottom wall 75 is formed with an inclination, it is preferable to set a positional relationship in which the distance between the highest position of the bottom wall 75 and the rotating shafts 81 and 82 is shorter than this maximum length. Due to the setting of such a distance, as depicted in FIG. 5, even when the surplus joining member C drops into between the respective cutting blades 83 and 84 for cutting dust in such a manner as to stick in the vertical direction, the upper end thereof protrudes upward from the rotating shafts 81 and 82. In other words, at least part of the surplus joining member C that has dropped in the vertical direction temporarily remains at the middle position of the cutting blades 83 and 84 for cutting dust in the height direction and a position at which the respective blades 83 and 84 overlap. This can favorably break the surplus joining member C that is long into a small piece shape.

According to such an embodiment, even when cutting dust from the package substrate P contains the surplus joining member C that is long, the surplus joining member C can be broken into small pieces by the cutting blades 83 and 84 for cutting dust. When the surplus joining member C that has become small pieces drops onto the bottom wall 75 together with the cutting water and then flows down by the inclination of the bottom wall 75, the surplus joining member C can be inhibited from remaining halfway and be collected by the cutting dust collection box 71. Therefore, it is possible to favorably prevent accumulation of cutting dust containing the surplus joining member C on the bottom wall 75.

Although the target of cutting processing by the cutting apparatus 1 of the above-described embodiment is the package substrate P, the material of the processed workpiece, the kind of device formed on the workpiece, and so forth are not limited. For example, as the workpiece, various works such as semiconductor device wafer, optical device wafer, semiconductor substrate, inorganic material substrate, oxide wafer, green ceramic substrate, and piezoelectric substrate may be used besides the package substrate. As the semiconductor device wafer, a silicon wafer or compound semiconductor wafer after device formation may be used. As the optical device wafer, a sapphire wafer or silicon carbide wafer after device formation may be used. Furthermore, silicon, gallium arsenide, and so forth may be used as the semiconductor substrate and sapphire, ceramic, glass, and so forth may be used as the inorganic material substrate. Moreover, lithium tantalate or lithium niobate after device formation or before device formation may be used as the oxide wafer.

Furthermore, although the configuration in which the cutting dust breaking unit 80 includes two rotating shafts 81 and 82 is employed in the above-described embodiment, either of them may be omitted and the number of rotating shafts may be set to one. Alternatively, three or more rotating shafts may be disposed to be juxtaposed. Moreover, the cutting blades 83 and 84 for cutting dust are not limited to cutting blades having a cutting edge along the outer circumference of the circular shape and may be cutting blades in which plural cutting edges are formed at a predetermined interval in the rotation direction. In addition, although the case in which the rotating shafts 81 and 82 are horizontally oriented in contrast to the inclined bottom wall 75 is described in the above-described embodiment, the rotating shafts 81 and 82 may be disposed to be inclined to the same direction as the bottom wall 75 and be parallel thereto.

Moreover, although the configuration including two cutting units 40 is employed in the cutting apparatus 1, the number of cutting units 40 may be one or be three or more.

Furthermore, although the embodiment of the present invention is described, what are obtained by combining the above-described embodiment and modification examples totally or partly may be employed as other embodiments of the present invention.

Moreover, embodiments of the present invention are not limited to the above-described embodiment and modification examples and may be variously changed, replaced, and modified in such a range as not to depart from the gist of technical ideas of the present invention. In addition, if a technical idea of the present invention can be implemented in another way due to advancement in the technique or another technique that is derivative, the technical idea may be implemented by using the method. Therefore, the scope of claims covers all embodiments that can be included in the range of technical ideas of the present invention.

As described above, the present invention is useful for a cutting apparatus that receives and collects cutting dust with cutting water.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A cutting apparatus, a side to which cutting water supplied to a cutting blade is scattered in association with rotation of the cutting blade being set as a downstream side of a processing feed direction, an opposite side to the downstream side being set as an upstream side of the processing feed direction, the cutting apparatus comprising:
    a chuck table that holds a package substrate;
    a cutting unit to which the cutting blade that cuts the package substrate held by the chuck table is mounted;
    a cutting water supply unit that supplies the cutting water to the cutting blade;
    a processing feed mechanism that carries out processing feed of the chuck table in an X-axis direction;
    an indexing feed mechanism that carries out indexing feed of the cutting unit in a Y-axis direction orthogonal to the X-axis direction;
    a plate-shaped cover that causes the cutting water and cutting dust to flow out to the downstream side of the chuck table in the processing feed direction;
    a cutting dust collection box that collects the cutting dust; and
    a cutting dust guide plate that is disposed on the downstream side in the processing feed direction relative to the chuck table and receives the cutting water and the cutting dust that flow to the downstream side after cutting to guide the cutting water and the cutting dust to the cutting dust collection box, wherein
    the cutting dust collection box is formed in such a manner that the cutting dust collection box receives the cutting water and the cutting dust that flow from the cutting dust guide plate into the cutting dust collection box and at least a bottom part allows the cutting water to flow and catches the cutting dust, and collects the cutting dust, and
    a cutting dust breaking unit that receives the cutting water and the cutting dust that flow from the plate-shaped cover and breaks the cutting dust into smaller pieces is disposed at a position onto which the cutting dust that flows from the plate-shaped cover drops over the cutting dust guide plate,
    wherein the cutting dust breaking unit comprises a plurality of parallel rotating shafts that each extend in a direction perpendicular to the processing feed direction, wherein each rotating shaft has a plurality of cutting blades for cutting dust that are fixed to a respective rotating shaft and wherein at least two of the rotating shafts rotate in opposite directions.

2. The cutting apparatus according to claim 1, wherein the cutting dust breaking unit has a rotating shaft that extends in a direction perpendicular to the processing feed direction and is rotatably disposed and cutting blades for cutting dust that are fixed to the rotating shaft in such a manner that a plurality of cutting blades are lined up at a predetermined interval and are capable of breaking the cutting dust, and
    the cutting dust is broken into smaller pieces each having a size equal to or smaller than the predetermined interval through dropping into between a plurality of the cutting blades for cutting dust that rotate.

3. The cutting apparatus according to claim 1 wherein the cutting dust collection box is not positioned directly below the cutting dust breaking unit.

4. The cutting apparatus according to claim 1 wherein the cutting dust guide plate is angled downward in a flow direction toward the cutting dust collection box so that water received on the cutting dust guide plate flows toward the cutting dust collection box; and
    wherein the cutting dust breaking unit has a rotating shaft that extends in a direction perpendicular to the processing feed direction and parallel to the flow direction and wherein cutting blades for cutting dust are fixed to the rotating shaft in such a manner that a plurality of cutting blades are lined up at a predetermined interval and are capable of breaking the cutting dust.

5. The cutting apparatus according to claim 4 wherein the cutting dust collection box is not positioned directly below the plurality of cutting blades of the cutting dust breaking unit.

6. The cutting apparatus according to claim 1, wherein the at least two of the rotating shafts that rotate in opposite directions are oriented generally horizontally and rotate such that the at least two of the rotating shafts rotate toward each other near a top portion of the cutting blades such that cutting dust is urged between the cutting blades of the at least two of the rotating shafts.

7. The cutting apparatus according to claim 6 wherein the cutting blades are circular cutting blades extending from respective rotating shafts in a direction perpendicular to a rotational axis of a respective rotating shaft.

8. The cutting apparatus according to claim 7 wherein the cutting blades of one of the at least two of the rotating shafts are offset from the cutting blades of the other of the at least two of the rotating shafts in a direction parallel to the rotational axes of the respective rotating shafts and such that edges of the circular blades overlap with each other in an area between the at least two rotating shafts.

9. A cutting apparatus comprising:
a chuck table that holds a package substrate;
a cutting unit to which the cutting blade that cuts the package substrate held by the chuck table is mounted;
a cutting water supply unit that supplies cutting water to the cutting blade;
a processing feed mechanism that carries out processing feed of the chuck table in an X-axis direction;
an indexing feed mechanism that carries out indexing feed of the cutting unit in a Y-axis direction orthogonal to the X-axis direction;
a cover that causes the cutting water and cutting dust to flow parallel to the X-direction toward a cutting dust guide plate;
wherein the cutting dust guide plate receives the cutting water and the cutting dust that flow from the cover after cutting and guides the cutting water and the cutting dust to a cutting dust collection box;
wherein the cutting dust collection box is formed in such a manner that the cutting dust collection box receives the cutting water and the cutting dust that flow from the cutting dust guide plate and wherein at least a bottom part of the dust collection box allows the cutting water to flow out of the dust collection box while catching and collecting the cutting dust; and
a cutting dust breaking unit positioned to receive the cutting water and the cutting dust that flow from the cover toward the cutting dust guide plate and breaks the cutting dust into smaller pieces,
wherein the cutting dust breaking unit comprises a plurality of parallel rotating shafts that each extend in a direction perpendicular to the X-direction, wherein each rotating shaft has a plurality of cutting blades for cutting dust that are fixed thereto and wherein at least two of the rotating shafts rotate in opposite directions.

10. The cutting apparatus according to claim 9 wherein the cutting dust guide plate is angled downward in a flow direction toward the cutting dust collection box so that water received on the cutting dust guide plate flows toward the cutting dust collection box; and
wherein the cutting dust breaking unit has a rotating shaft that extends in a direction perpendicular to the X-direction and parallel to the flow direction and wherein cutting blades for cutting dust are fixed to the rotating shaft in such a manner that a plurality of cutting blades are lined up at a predetermined interval and are capable of breaking the cutting dust.

11. The cutting apparatus according to claim 10 wherein the cutting dust collection box is not positioned directly below the plurality of cutting blades of the cutting dust breaking unit.

12. The cutting apparatus according to claim 9 wherein the cutting dust collection box is not positioned directly below the cutting dust breaking unit.

13. The cutting apparatus according to claim 9, wherein the at least two of the rotating shafts that rotate in opposite directions are oriented generally horizontally and rotate such that the at least two of the rotating shafts rotate toward each other near a top portion of the cutting blades such that cutting dust is urged between the cutting blades of the at least two of the rotating shafts.

14. The cutting apparatus according to claim 13 wherein the cutting blades are circular cutting blades extending from respective rotating shafts in a direction perpendicular to a rotational axis of a respective rotating shaft.

15. The cutting apparatus according to claim 14 wherein the cutting blades of one of the at least two of the rotating shafts are offset from the cutting blades of the other of the at least two of the rotating shafts in a direction parallel to the rotational axes of the respective rotating shafts and such that edges of the circular blades overlap with each other in an area between the at least two rotating shafts.

* * * * *